United States Patent
Kawarada et al.

[11] Patent Number: 5,420,879
[45] Date of Patent: May 30, 1995

[54] SOLID STATE LASER

[75] Inventors: Hiroshi Kawarada, Kanagawa; Takahiro Imai, Hyogo; Yoshiki Nishibayashi, Hyogo; Naoji Fujimori, Hyogo, all of Japan

[73] Assignee: Sumitomo Electric Industries, Ltd., Osaka, Japan

[21] Appl. No.: 120,757

[22] Filed: Sep. 15, 1993

[30] Foreign Application Priority Data

Sep. 16, 1992 [JP] Japan .................. 4-246511

[51] Int. Cl.⁶ .................................. H01S 3/16
[52] U.S. Cl. ........................ 372/41; 372/34; 372/69
[58] Field of Search ............ 372/42, 41, 30, 69, 372/70, 34

[56] References Cited

U.S. PATENT DOCUMENTS 3,895,313  7/1975  Seitz ..................... 372/103
4,638,484  1/1987  Rand et al. ............... 372/42

FOREIGN PATENT DOCUMENTS 0346794  12/1989  European Pat. Off. .
0454566  10/1991  European Pat. Off. .
63-246885  10/1988  Japan .
64-20689  1/1989  Japan .

OTHER PUBLICATIONS

Partlow et al, "Cryogenic Cathodoluminescence of Plasma-Deposited Polycrystalline Diamond Coatings", Journal of Applied Physics, vol. 67, No. 11, 1 Jun. 1990, New York, pp. 7019-7025.

Kawarade et al, "Cathodoluminescence and Electroluminescence of Undoped and Boron-Doped Diamond Formed by Plasma Chemical Vapor Deposition," Journal of Applied Physics, vol. 67, No. 2, 15 Jan. 1990, New York, pp. 983-989.

Kawarada et al, "Cathodoluminescence and Electroluminescence of Undoped and Boron-Doped Diamond Formed by Plasma Chemical Vapor Desposition", Journal of Applied Physics, 67 (1990) pp. 983-989.

Kawarada et al, "Blue and Green Cathodoluminescence of Synthesized Diamond Films Formed by Plasma-Assisted Chemical Vapour Deposition", Japanese Journal of Applied Physics, vol. 27, No. 4, Apr. 1988, pp. L683-L686.

Primary Examiner—Léon Scott, Jr.
Attorney, Agent, or Firm—Cushman Darby & Cushman

[57]  ABSTRACT

A solid state laser includes a diamond crystal as a medium of laser beam emission, which generates a laser beam having a wavelength of 225 to 300 nm through exciton light emission.

14 Claims, 1 Drawing Sheet

SOLID STATE LASER

BACKGROUND OF THE INVENTION

The present invention relates to a solid state laser which oscillates in a range of an ultraviolet ray.

In a short wavelength region extending from blue in a visible light radiation to ultraviolet rays (400 nm or less), a laser beam which is compact, highly efficient and highly stable has been demanded for use in a high density optical recording device and the like.

Conventionally, in the short wavelength region of 400 nm or less, there are various light sources which serve simply as a light source, but lasers which can oscillate in such a short wavelength region are limited. One such laser is a gas laser such as a nitrogen laser, and an excimer laser. However, gas lasers are large in size and poor in efficiency, and gas laser are only able to oscillate in the form of a pulse having a short duration, so that the gas laser cannot be used in the optical recording. There is also known another laser system in which a laser beam having a long wavelength of 500 nm or more is converted into a harmonic component having a wavelength which is ½ or ⅓ of the long wavelength. However, this laser system lowers the efficiency of the laser by two or three orders and thus a large laser is required consequently, this laser system cannot be applied practically.

To spread widely the short wavelength laser, there is necessitated a laser which is compact, can stably oscillate, and is highly efficient. For this purpose, it is desirable that the laser includes a laser oscillating medium of a solid state crystal.

It has been already shown that diamond emits light in a region ranging from the visible radiation to the ultraviolet rays through various excitation methods. (See, example, "Exciton Luminescence of Diamond" H. Kawarada, A. Hiraki, NEW DIAMOND, Vol. 6 No. 3 (1990) p2, "Cathodoluminescence and electroluminescence of undoped and boron-doped diamond formed by plasma chemical vapor deposition" H. Kawarada, Y. Yokota, Y. Mori, k. Nishimura, A. Hiraki, J. Appl. Phys., 67 (1990) p983, "Blue and green cathodoluminescence of synthesized diamond films formed by plasma-assisted chemical vapor deposition," H. Kawarada, K. Nishimura, T. Ito, J. Suzuki, K. Mar, Y. Yokota, Jap. J. Appl. Phys. 27 (4) (1988) pL683.

Also, there is proposed a method in which a color center is formed by introducing impurities or defects into a diamond crystal in order to produce a solid state laser in a visible radiation region. (See example, Japanese Patent Unexamined Publication No. Sho.63-246885, Japanese Patent Unexamined Publication No. Sho.64-20689).

As described above, the diamond is very stable as a material, provides a high degree of transparency and has a great thermal conductivity, so that the diamond is excellent as a medium for the oscillation of an ultraviolet solid state laser. For this reason, the practical application of the diamond has been demanded. However, the diamond laser oscillation in the ultraviolet range has never been attained practically.

SUMMARY OF THE INVENTION

In view of the above, an object of the present invention is to provide a compact and stable solid state laser which can oscillate in a range of ultraviolet ray.

The solid state laser of the present invention includes a diamond crystal as a medium of laser emission and uses exciton light emission of the diamond crystal to generate a laser beam with a wavelength of 225 nm to 300 nm.

DETAILED DESCRIPTION OF THE INVENTION

Figure 1:
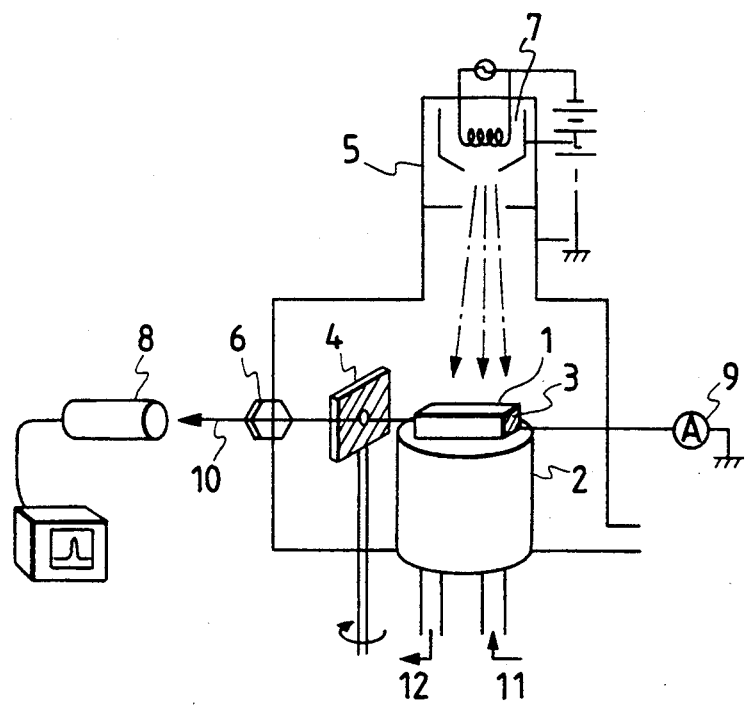
FIG. 1 is a schematic view of an embodiment of a solid state laser according to the present invention.

A diamond crystal that has a high crystallinity and includes a properly controlled amount of impurities, generates light emission called exciton light emission when it is excited due to injection of electrons or carriers thereinto. An electron and a positive hole, which are generated due to excitation, are paired with each other to provide an exciton. When the electron and positive hole forming the exciton are recombined with each other, light is emitted. When excited, the diamond crystal generates various kinds of light emission. The exciton light emission is one of such light emission of the diamond crystal and, in the exciton light emission, light having a wavelength range of 225 to 300 nm is emitted.

The present inventors have made use of the exciton light emission and succeeded in the ultraviolet ray laser oscillations using the diamond crystal according to the following method.

(1) As exciting means, injection of carriers by means of electron irradiation, X-ray irradiation, ultraviolet ray irradiation or electric connection is used to carry out a strong excitation of 0.1 W/cm$^2$ or more per unit area of diamond.

(2) The diamond crystal is cooled by a cooling device so that the temperature of the diamond crystal can be kept at a room temperature or lower even when energy is given to the diamond crystal by the strong exciting means.

(3) A pair of reflectors mutually facing to each other are used to form an optical resonator.

The exciting means such as an electron beam or the like generates a large amount of excitons in the diamond crystal. Ultraviolet rays, which are generated when these excitons are recombined together, are discharged all at once by the optical resonator as laser beams which are of the same wavelength and phase.

The diamond crystal may be a natural one. However, in fact, it is hard to obtain such natural diamond that contains few impurities and is uniform in quality. For this reason, the diamond crystal is preferably an artificial diamond which is synthesized according to a high pressure synthesizing method or a vapor phase synthesizing method.

In particular, the vapor phase synthesized diamond may sometimes contain carbon which has a structure of graphite or the like other than diamond. Such non-diamond carbon is very harmful to the exciton light emission. Irrespective of diamond synthesizing methods, as allowable standards for the amount of the non-diamond carbon contained in the diamond, the following conditions must be satisfied: that is, when it is observed according to a Raman scattering spectrum method, the half width of the particular scattering peak of diamond having a peak of 1330 cm$^{-1}$ to 1340 cm$^{-1}$ is 10 cm$^{-1}$ or less, and the scattering peak height of non-diamond carbon appearing in the range of 1500 cm$^{-1}$ to 1600 cm$^{-1}$ is 20% or less of the particular scattering peak height of diamond.

In the diamond crystal, as other impurity elements than the above-mentioned carbon, there may be contained a small amount of nitrogen and boron. The allowable densities of these impurity elements in the diamond crystal for the exciton solid state laser are respectively 500 ppm. If the density is greater than 500 ppm, then the nitrogen segregates in the diamond and thus the nitrogen becomes the center of the recombination that prevents the excitons from emitting light. Also, the total amount of the impurities including the nitrogen and boron in the diamond crystal is preferably 2000 ppm or less. If the total amount of the impurities exceeds 2000 ppm, similarly to the case in which the impurity consists only of nitrogen, the impurities become the center of the recombination that prevents the excitons from emitting light.

According to the kinds and amounts of the impurities in the diamond crystal and crystal defects, there are oscillated laser beams which are in the wavelength range of 225 nm to 300 nm but are different from each other.

As a method of introducing defects and impurities into the diamond crystal, there are available a method of mixing impurities into the raw materials when the diamond crystal is synthesized under high pressure, a method of mixing impurities when the diamond crystal is synthesized in a vapor phase, a method of injecting impurities as ions, a method of producing defects by means of particle beams (such as an electron beam, X rays and a neutron beam), a method of heating the diamond crystal under low pressure or under high pressure, and the combinations thereof.

In a polycrystalline diamond, the crystal grain boundary thereof and the ends of the crystal particles become the center of the recombination which deactivates the excitons. Therefore, the diamond crystal may be preferably a single crystal and, when the diamond crystal is a polycrystalline one, it is important that each of the crystal grains is as large as possible. The size of the single crystal and the size of each of the crystal grains of the polycrystalline diamond must be at least 1 μm or more. If the size is less than 1 μm, then there is inconveniently increased the number of the excitons that are deactivated in the grain boundary.

As an exciting method of generating the exciton light emission, there are available a method of exciting the diamond crystal by irradiating an electron beam, X rays, ultraviolet rays, ion beams or the like from outside, and a method of injecting carriers into the diamond by applying an electric field to electrical junctions provided in the diamond such as a pn junction, a Shottky junction, an MIS junction and a heterojunction.

In the current art, the method of irradiating the electron beam, ultraviolet rays or the like is suited to generate a large number of excitons in the diamond. The electron beam may be preferably irradiated with acceleration energy of 1 KeV or greater. As a desirable ultraviolet light ray source, there are available an excimer laser, a mercury lamp, a (heavy) hydrogen discharge lamp, a flash lamp, an SOR light ray and the like, each of which includes a large amount of wavelength components shorter than 225 nm, that is, the absorbing end of the diamond.

Also, in order to make compact the solid state laser, it is effective to use a method of injecting carries into the diamond by means of a Shottky junction with respect to metal or a heterojunction with respect to boron nitride, silicon carbide or the like. To produce such electrical junctions, it is necessary to provide the diamond with a semiconductor characteristic. For this purpose, elements such as lithium, beryllium, boron, nitrogen, aluminium, silicon, phosphorous, sulfur, chlorine, gallium, arsenic, selenium must be introduced into the diamond crystal by the above-mentioned method.

In addition, there is available a method of exciting the diamond by applying an alternating electric field to metal electrodes respectively disposed on the two sides of the diamond. In this case, the diamond may be an insulating one as well. A direct current electric field may also be used.

The efficiency of the exciton light emission is lowered by scattering of the excitons due to heat and, for this reason, it is preferable that the diamond crystal is kept at a low temperature which is equal to or lower than a liquid nitrogen temperature (77K). However, since the bond energy of the excitons is large in the diamond, laser oscillation is possible even at a room temperature.

In any of the diamond exciting methods, the temperature of the diamond is caused to rise and, for this reason, strong and effective cooling means must be prepared. Also, if it is not necessary to oscillate the laser continuously, then the diamond crystal may be preferably excited intermittently in a pulse manner.

In order to enhance the efficiency of the laser oscillation, it is preferable that two reflectors forming an optical resonator are formed by vacuum evaporating metal onto the polished surface of the diamond crystal. When the working accuracy of the diamond crystal does not reach a level to obtain the degree of parallel necessary for the optical resonator, at least one of the reflectors may be disposed outside of the diamond crystal.

In the solid state laser according to the present invention, laser beams having a plurality of wavelengths can be oscillated simultaneously. In order to oscillate only a single wavelength efficiently, by disposing a wavelength select element such as a prism or a diffraction grating within the optical resonator, a laser beam of one wavelength can be oscillated efficiently and a wavelength bandwidth can be narrowed effectively. The solid state laser according to the present invention can also be used as a light amplifier.

EXAMPLE

An Ib-type diamond single crystal synthesized according to a high pressure synthesizing method and including nitrogen and boron each of 25 ppm on average was worked into a rectangular parallelepiped of 7×3×1 mm$^3$. All of the surfaces of the rectangular parallelepiped diamond were polished to a surface roughness of Rmax 500 nm or less, and gold was vacuum evaporated onto one surface of the rectangular parallelepiped having a size of 3×1 mm$^2$ to thereby provide a total internal reflector 3. Then, the diamond 1, as shown in FIG. 1, was set on a cooling support member 2 of copper which had been cooled by liquid nitrogen and air in the peripheries of the diamond was exhausted to a vacuum of the order of 10$^{-7}$ Torr.

An electron beam having an acceleration voltage of 25 KV and a current of 0.6 mA was irradiated for about 0.02 sec. repeatedly at an interval of 1 sec. intervals onto the surface of the diamond 1 having a size of 7×3 mm² from an electron gun 5 disposed above the diamond 1. While repeating the irradiation of the electron beam, when the angle of a semipermeable mirror 4 disposed on the opposed side to the total internal reflector 3 was adjusted finely, then the oscillations of a laser beam of 237.6 nm were confirmed.

Incidentally, in FIG. 1, reference numeral 6 designates a laser extract window; 7, a vacuum container; 8, an optical detector; 9, an electric current detector; 10, a laser beam; 11, an inlet of liquid nitrogen; and 12, an outlet of liquid nitrogen.

Figure 2:
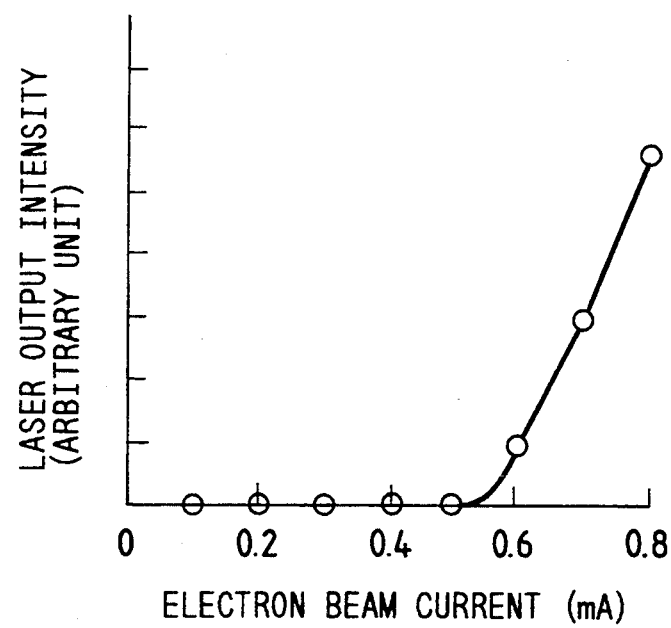
FIG. 2 is a graphical representation of variations in the intensity of a laser output with respect to an electron beam current.

When, under the above-mentioned conditions, the amount of current of the electron beam was decreased and the state of the laser oscillations was observed, then it was found, as shown in FIG. 2, that the threshold value for the laser oscillations could be obtained at the electron beam current of 0.54 m.

As described above, according to the present invention, there can be obtained a compact and stable ultraviolet ray solid state laser. The solid state laser of the present invention is suitable for use in a high density optical recording device and the like.

What is claimed is:

1. A solid state laser comprising a diamond crystal as a medium of laser emission, said diamond crystal generating a laser beam with a wavelength of 225 nm to 300 nm through exciton light emission exciting means for exciting said diamond crystal; and energy extracting means for extracting said laser beam from said diamond crystal.

2. A solid state laser comprising:
   a diamond crystal as a medium of laser emission, said diamond crystal generating a laser beam with a wavelength of 223 nm to 300 nm through eciton light emission;
   an exciting means for exciting said diamond crystal;
   a cooling means for keeping said diamond crystal at a constant temperature;
   an optical resonator for resonating said laser be generated by said diamond crystal- and means for extracting said laser beam from said optical resonator.

3. A solid state laser as claimed in claim 2, wherein said exciting means is one selected from a group consisting of an electron beam generating device, an ultraviolet ray generating device, an X ray generating device and an ion beam generating device.

4. A solid state laser as claimed in claim 3, wherein said electron beam generating device generates an electron beam having an energy of at least 1 KeV.

5. A solid state laser as claimed in claim 3, wherein said ultraviolet ray generating device generates an ultraviolet ray having a wavelength up to 225 nm.

6. A solid state laser as claimed in claim 2, wherein said diamond crystal includes impurities selected from a group consisting of lithium, beryllium, boron, nitrogen, aluminum, silicon, phosphorous, sulfur, chlorine, gallium, arsenic, selenium, a total amount of said impurities being no greater than 2000 ppm.

7. A solid state laser as claimed in claim 6, wherein said diamond crystal includes an electric junction to which an electric field is applied to excite said diamond crystal, said electric junction being one selected from a group consisting of a PN junction, a Schottky junction, an MIS junction and a heterojunction.

8. A solid state laser as claimed in claim 2, wherein said cooling means keeps said diamond crystal at a temperature that is no greater than room temperature.

9. A solid state laser as claimed in claim 2, said optical resonator includes a reflection mirror formed of a metal deposited on a polished surface of said diamond crystal.

10. A solid state laser as claimed in claim 2, wherein said exciting means includes at least one electrode disposed on said diamond crystal and a power supply device for applying a direct current electric field or an alternating current electric field to said diamond crystal.

11. A solid state laser as claimed in claim 2, wherein said exciting means applies an energy of at least 0.1 W/cm² or more to said diamond crystal.

12. A solid state laser as claimed in claim 2, wherein, when said diamond crystal is observed by a Raman scattering spectrum method, said diamond crystal has a half width of a particular scattering peak of diamond with a peak of 1330 cm$^{-1}$ to 1340 cm$^{-1}$, said half width as being up to 10 cm$^{-1}$, and a scattering peak height of non-diamond carbon appearing in a range of 1500 cm$^{-1}$ to 1600 cm$^{-1}$, said scattering peak height being up to 20% of a height of said particular scattering peak of diamond.

13. A solid state laser as claimed in claim 2, wherein when said diamond crystal is one of a single crystal or a polycrystal having crystal grains of a size of at least 1 μm.

14. A laser emission medium for use in a solid state laser, comprising: a diamond crystal as a medium of laser emission, said diamond crystal generating a laser beam with a wavelength of 225 nm to 300 um through exciton light emission.

* * * * *